(12) United States Patent
Iorga et al.

(10) Patent No.: US 12,301,193 B2
(45) Date of Patent: May 13, 2025

(54) PULSE FILTER

(71) Applicant: Rambus Inc., San Jose, CA (US)

(72) Inventors: Cosmin Iorga, Westlake Village, CA (US); Ruibing Zhang, West Hills, CA (US)

(73) Assignee: Rambus Inc., San Jose, CA (US)

( * ) Notice: Subject to any disclaimer, the term of this patent is extended or adjusted under 35 U.S.C. 154(b) by 0 days.

(21) Appl. No.: 18/236,857

(22) Filed: Aug. 22, 2023

(65) Prior Publication Data

US 2024/0080016 A1   Mar. 7, 2024

Related U.S. Application Data

(60) Provisional application No. 63/426,975, filed on Nov. 21, 2022, provisional application No. 63/403,728, filed on Sep. 3, 2022.

(51) Int. Cl.
*H03H 11/04*   (2006.01)

(52) U.S. Cl.
CPC .................................. *H03H 11/04* (2013.01)

(58) Field of Classification Search
CPC ............. H03K 5/1252; H03K 19/0005; H03K 19/01742; H03K 19/20; H03K 19/21; H03K 2005/00019; H03K 2005/00215; H03K 3/017; H03K 3/027; H03K 5/01; H03K 5/04; H03K 5/13; H03K 5/135; H03K 5/1565; H03K 2005/00143; H03K 3/02; H03K 3/356069; H03K 3/356113; H03K 5/082; H03K 5/133; H03K 5/15; H03K 5/06; G06F 13/4282; G06F 2213/0016; G06F 1/04; G06F 1/10; G06F 13/4086;

(Continued)

(56) References Cited

U.S. PATENT DOCUMENTS 4,300,164 A * 11/1981 Sacks ...................... G06V 10/10
                                                          358/461
4,471,235 A *  9/1984 Sakhuja ............. G01R 29/0273
                                                           327/34

(Continued)

OTHER PUBLICATIONS

Chandana Krishna. "Designing I/O Drivers for Integrated Circuit I2C Modules". Aug. 5, 2020, Downloaded on Aug. 31, 2022 from: https://www.allaboutcircuits.com/technical-articles/designing-input-output-drivers-for-integrated-circuit-i2c-modules/. 7 pages.

*Primary Examiner* — John W Poos
(74) *Attorney, Agent, or Firm* — The Neudeck law Firm, LLC

(57) ABSTRACT

A pulse filter circuit is configured to eliminate pulses that are less than a specified duration and pass those that are greater than the specified duration. A buffer receives a signal and applies the buffered signal to a resistance-capacitance charging-discharging circuit (e.g., RC filter). When the output of the RC filter has, in response to the buffered signal, charged or discharged, as appropriate, to cause the output of a slicer to change, logic circuitry controls switching circuitry to pull the output of the RC filter to be fully charged or discharged, respectively. In this manner, pulses that are too short to charge/discharge the RC filter enough to cross the threshold of the slicer do not reach the slicer circuit output, but pulses that are long enough to cross the slicer threshold are transmitted by the slicer.

20 Claims, 13 Drawing Sheets

(58) Field of Classification Search
CPC ............. G06F 13/4072; G06F 13/4077; G06F 13/4291; H03H 17/02
See application file for complete search history.

(56) References Cited

U.S. PATENT DOCUMENTS

| | | | |
|---|---|---|---|
| 6,914,861 B2 * | 7/2005 | Chou | ............... G11B 20/10009 |
| | | | 369/59.16 |
| 7,397,292 B1 | 7/2008 | Potanin | |
| 7,471,607 B2 * | 12/2008 | Wu | ................. G11B 20/10009 |
| | | | 369/59.21 |
| 9,590,605 B2 | 3/2017 | Gopal | |
| 11,223,343 B2 | 1/2022 | Mertens | |

* cited by examiner

```
┌─────────────────────────────────────────────────────────────┐
│ RECEIVE AN INPUT SIGNAL HAVING A PLURALITY OF PULSE WIDTHS  │
│                            602                              │
└─────────────────────────────────────────────────────────────┘
                              │
┌─────────────────────────────────────────────────────────────┐
│ BUFFER THE INPUT SIGNAL TO GENERATE A BUFFERED INPUT SIGNAL │
│            HAVING THE PLURALITY OF PULSE WIDTHS             │
│                            604                              │
└─────────────────────────────────────────────────────────────┘
                              │
┌─────────────────────────────────────────────────────────────┐
│  PROVIDE THE BUFFERED INPUT SIGNAL TO A RESISTOR-CAPACITOR  │
│   CIRCUIT CALIBRATED TO A FIRST TIME CONSTANT BASED ON TIMING│
│      INFORMATION, THE RESISTOR-CAPACITOR CIRCUIT HAVING A   │
│              CHARGING-DISCHARGING CAPACITANCE               │
│                            606                              │
└─────────────────────────────────────────────────────────────┘
                              │
┌─────────────────────────────────────────────────────────────┐
│  PROVIDE A CHARGING-DISCHARGING SIGNAL FROM THE RESISTOR-   │
│      CAPACITOR CIRCUIT TO A SLICER INPUT OF A SLICER        │
│                            608                              │
└─────────────────────────────────────────────────────────────┘
                              │
┌─────────────────────────────────────────────────────────────┐
│  BASED ON THE SLICER DETERMINING THE CHARGING-DISCHARGING   │
│    SIGNAL MEETS A FIRST THRESHOLD CONDITION AND THE INPUT   │
│ SIGNAL MEETING A SECOND THRESHOLD CONDITION, CHARGING THE   │
│ CHARGING-DISCHARGING CAPACITANCE TO A FIRST POWER SUPPLY    │
│                          VOLTAGE                            │
│                            610                              │
└─────────────────────────────────────────────────────────────┘
                              │
┌─────────────────────────────────────────────────────────────┐
│  BASED ON THE SLICER DETERMINING THE CHARGING-DISCHARGING   │
│  SIGNAL MEETS DOES NOT MEET THE FIRST THRESHOLD CONDITION   │
│  AND THE INPUT SIGNAL MEETING A THIRD THRESHOLD CONDITION,  │
│  DISCHARGING THE CHARGING-DISCHARGING CAPACITANCE TO A      │
│             SECOND POWER SUPPLY VOLTAGE.                    │
│                            612                              │
└─────────────────────────────────────────────────────────────┘
```

*FIG. 6*

```
┌─────────────────────────────────────────────────────────────┐
│ RECEIVE A FIRST PULSE WITH A FIRST DURATION THAT IS LESS THAN│
│                    A FIRST TIME PERIOD                       │
│                            802                               │
└─────────────────────────────────────────────────────────────┘
                              │
┌─────────────────────────────────────────────────────────────┐
│  PROVIDE THE FIRST PULSE TO A RESISTOR-CAPACITOR CIRCUIT TO  │
│      GENERATE A FIRST CHARGING-DISCHARGING SIGNAL            │
│                            804                               │
└─────────────────────────────────────────────────────────────┘
                              │
┌─────────────────────────────────────────────────────────────┐
│  AT THE END OF THE FIRST PULSE DETERMINE THE FIRST CHARGING- │
│  DISCHARGING SIGNAL DOES NOT MEET A THRESHOLD CONDITION      │
│                            806                               │
└─────────────────────────────────────────────────────────────┘
                              │
┌─────────────────────────────────────────────────────────────┐
│     BASED ON THE FIRST CHARGING-DISCHARGING SIGNAL NOT       │
│    MEETING THE THRESHOLD CONDITION, NOT TRANSMITTING THE     │
│                        FIRST PULSE                           │
│                            808                               │
└─────────────────────────────────────────────────────────────┘
                              │
┌─────────────────────────────────────────────────────────────┐
│   RECEIVE A SECOND PULSE WITH A SECOND DURATION THAT IS      │
│         GREATER THAN THE FIRST TIME PERIOD                   │
│                            810                               │
└─────────────────────────────────────────────────────────────┘
                              │
┌─────────────────────────────────────────────────────────────┐
│ PROVIDE THE SECOND PULSE TO THE RESISTOR-CAPACITOR CIRCUIT   │
│    TO GENERATE A SECOND CHARGING-DISCHARGING SIGNAL          │
│                            812                               │
└─────────────────────────────────────────────────────────────┘
                              │
┌─────────────────────────────────────────────────────────────┐
│     AT THE END OF THE SECOND PULSE DETERMINE THE SECOND      │
│     CHARGING-DISCHARGING SIGNAL MEETS THE THRESHOLD          │
│                         CONDITION                            │
│                            814                               │
└─────────────────────────────────────────────────────────────┘
                              │
┌─────────────────────────────────────────────────────────────┐
│  BASED ON THE SECOND CHARGING-DISCHARGING SIGNAL MEETING     │
│   THE THRESHOLD CONDITION, TRANSMITTING THE SECOND PULSE     │
│                            816                               │
└─────────────────────────────────────────────────────────────┘
```

*FIG. 8*

PULSE FILTER

BRIEF DESCRIPTION OF THE DRAWINGS

FIG. 6 is a flowchart illustrating a method of operating a pulse filter.

FIG. 8 is a flowchart illustrating a method filtering received pulses.

DETAILED DESCRIPTION OF THE EMBODIMENTS

In an embodiment, a pulse filter circuit is configured to eliminate pulses that are less than a specified duration. The pulse filter circuit receives a signal having pulses of varying durations with some pulses being less than the specified duration and some more than the specified duration. A buffer receives the signal and applies the buffered signal to a resistance-capacitance charging-discharging circuit (e.g., RC filter). The output of the RC filter is provided to a slicer circuit. When the output of the RC filter has, in response to the buffered signal, charged or discharged, as appropriate, to cause the output of the slicer to change, logic circuitry controls switching circuitry to pull the output of the RC filter to be fully charged or discharged, respectively. In this manner, pulses that are too short to charge/discharge the RC filter enough to cross the threshold of the slicer do not reach the slicer circuit output, but pulses that are long enough to cross the slicer threshold are transmitted by the slicer.

Figure 1A:
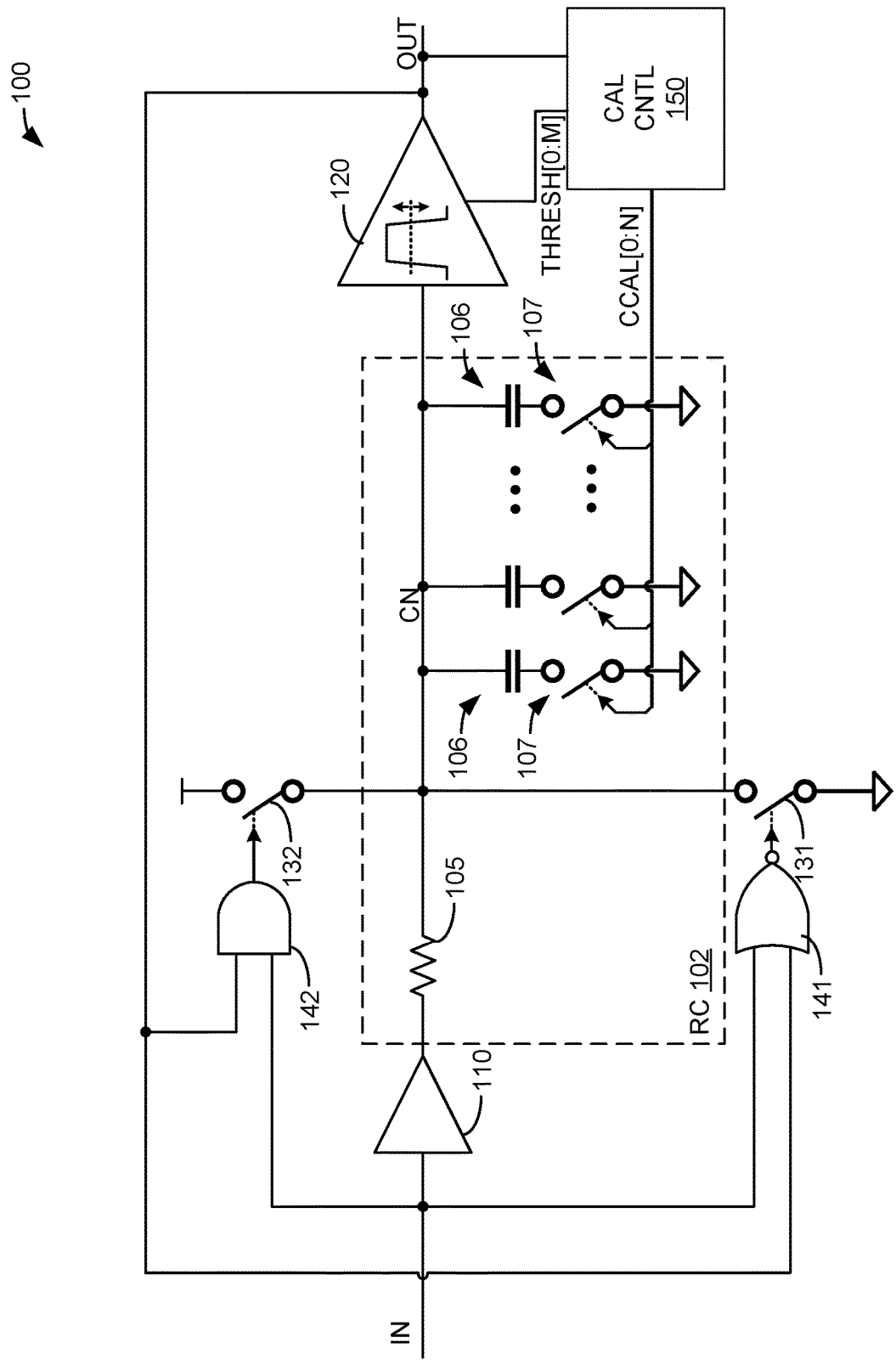
FIG. 1A is a diagram illustrating a pulse filter.

FIG. 1A is a diagram illustrating a pulse filter. In FIG. 1A, pulse filter circuitry 100 comprises resistance-capacitance (RC) charging-discharging circuitry 102 (e.g., RC filter), buffer 110, slicer 120, switching circuitry 131, switching circuitry 132, 2-input NOR gate 141, 2-input AND gate 142, and calibration control circuitry 150. RC charging-discharging circuitry 102 includes resistance 105, adjustable capacitance 106, and capacitance adjustment circuitry 107.

Capacitance adjustment circuitry 107 is operatively coupled to calibration control circuitry 150. Capacitance adjustment circuitry 107 is operatively coupled to calibration control circuitry 150 to calibrate the total capacitance of adjustable capacitance 106 that is charged and discharged as part of RC charging-discharging circuitry 102. The total capacitance of adjustable capacitance 106 that is charged and discharged as part of RC charging-discharging circuitry 102 is adjusted to account for manufacturing variations during the manufacture of an integrated circuit that includes pulse filter circuitry 100.

Calibration control circuitry 150 is operatively coupled to slicer 120. Calibration control circuitry 150 is operatively coupled to slicer 120 to adjust at least one threshold that, when the voltage at the input of slicer 120 crosses that threshold voltage level, changes the state (e.g., "1" or "0") being output by slicer 120. Calibration control circuitry 150 adjusts the threshold of slicer 120 to control the minimum pulse width that will be passed by pulse filter circuitry 100.

The input of buffer 110 receives an input signal (IN). The output of buffer 110 is connected to a first terminal of resistance 105 of RC charging-discharging circuitry 102. The second terminal of resistance 105 is connected to node/signal CN. The CN signal (i.e., the voltage on node CN) is the output signal of RC charging-discharging circuitry 102. CN is connected to the input of slicer 120. The output of slicer 120 is the output of pulse filter circuitry 100 (OUT).

CN is also connected to a first node of switching circuitry 131 (e.g., comprising an n-channel field effect transistor—NFET). A second node of switching circuitry 131 is connected to a negative reference (e.g., ground, $V_{SS}$, etc.) voltage. Switching circuitry 131 is controlled by the output of NOR gate 141 ($CNTL_{131}$). A logical "1" on $CNTL_{131}$ causes switching circuitry 131 to be conducting. A logical "0" on $CNTL_{131}$ causes switching circuitry 131 to be high impedance (e.g., nonconducting).

Switching circuit is controlled by NOR gate 141 to provide a low impedance path between CN and the negative reference voltage when both IN and OUT are logical "0"'s. The low impedance path between CN and the negative reference voltage when both IN and OUT are logical "0"'s quickly discharges (lowers) the voltage on capacitance 106. Since for OUT to be a logical "0" the voltage on CN must be below the threshold voltage of slicer 120, quickly discharging the voltage on capacitance 106 further pulls CN below the threshold voltage of slicer 120 thereby reinforcing slicer 120's decision to output of a logical "0".

CN is also connected to a first node of switching circuitry 132 (e.g., comprising a p-channel field effect transistor—PFET). A second node of switching circuitry 132 is connected to a positive (e.g., $V_{DD}$, etc.) reference (or supply) voltage. Switching circuitry 132 is controlled by the output of AND gate 142 ($CNTL_{132}$). A logical "1" on $CNTL_{132}$ causes switching circuitry 132 to be conducting. A logical "0" on $CNTL_{132}$ causes switching circuitry 131 to be high impedance (e.g., nonconducting).

Switching circuit is controlled by AND gate 142 to provide a low impedance path between CN and the positive reference voltage when both IN and OUT are logical "1"'s. The low impedance path between CN and the positive reference voltage when both IN and OUT are logical "1"'s quickly charges (raises) the voltage on capacitance 106. Since for OUT to be a logical "1" the voltage on CN must be above the threshold voltage of slicer 120, quickly charging the voltage on capacitance 106 further pulls CN above the threshold voltage of slicer 120 thereby reinforcing slicer 120's decision to output of a logical "1".

Figure 2A:
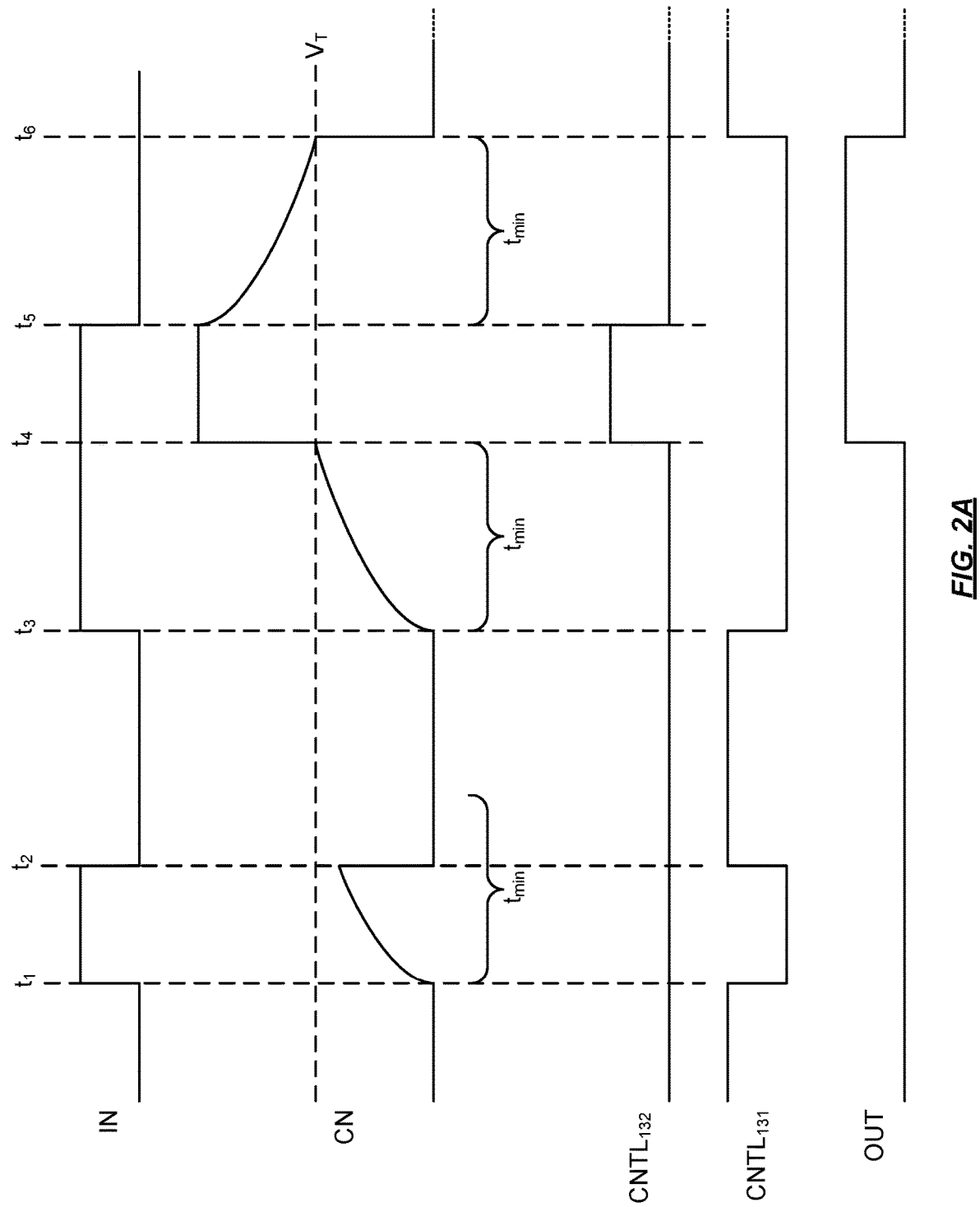
FIGS. 2A-2B are example timing diagrams illustrating the operations of a pulse filter.
Figure 2B:
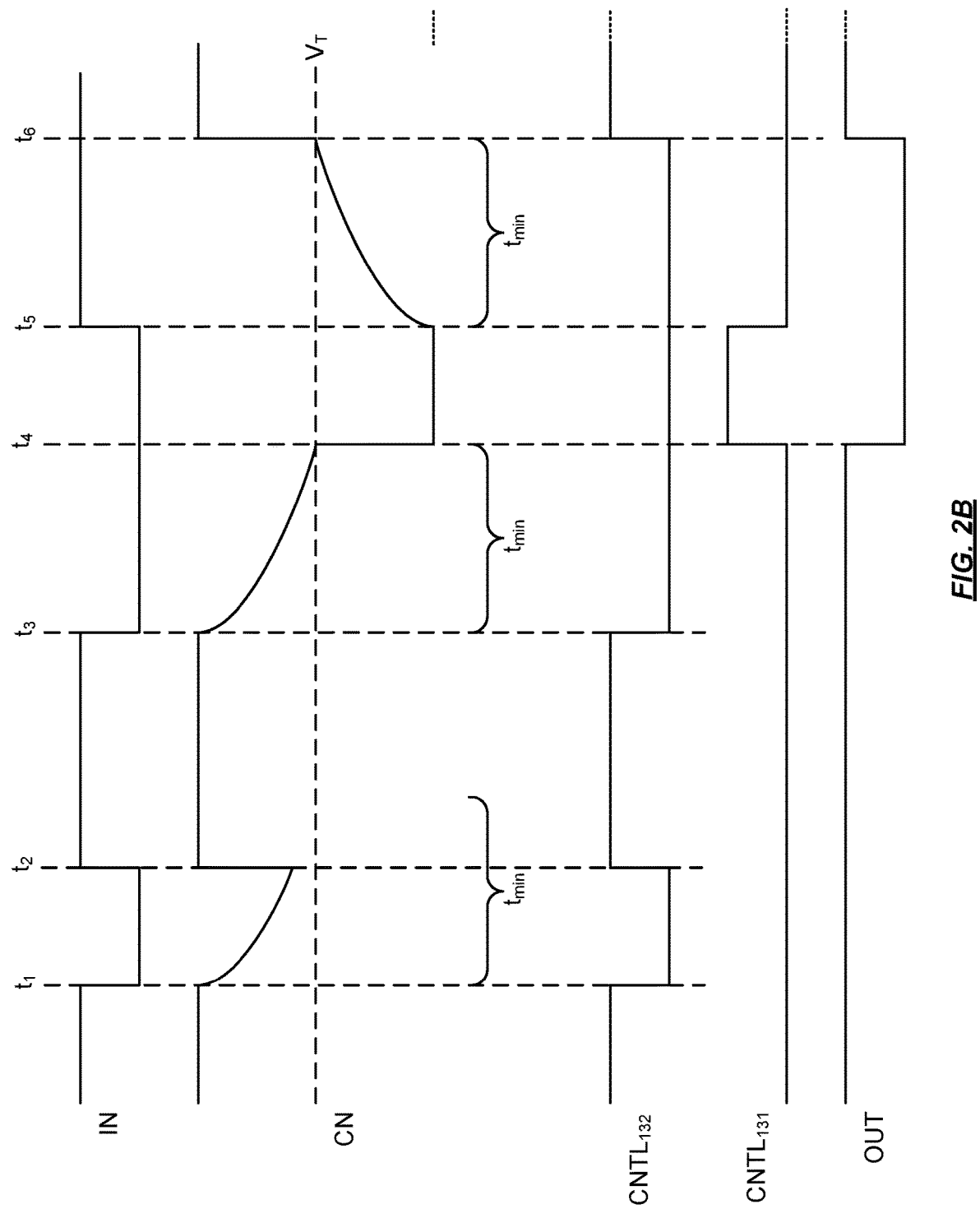

FIGS. 2A-2B are example timing diagrams illustrating the operations of pulse filter circuitry 100. In FIG. 2A, the input signal (IN) and the output signal (OUT) both start as a logical "0"'s. CN is at the negative reference voltage and is therefore below the threshold voltage ($V_T$) of slicer 120. Thus, since IN and OUT are both logical "0"'s, $CNTL_{131}$ is at a logical "1" and $CNTL_{132}$ is at a logical "0". Since $CNTL_{131}$ is at a logical "1", switching circuitry 131 is conducting thereby holding CN at the negative reference voltage.

At time $t_1$, IN switches from a logical "0" to a logical "1". Thus, because IN and OUT are no longer both logical "0"'s, $CNTL_{131}$ switches to a logical "0" and is thereby no longer holding CN at the negative reference voltage. Because the output of buffer 110 rises with the switching of IN, and because $CNTL_{131}$ is no longer holding CN to the negative reference voltage, buffer 110 begins charging capacitance 106 via resistance 105—thereby forming an RC charging circuit with a time constant that is substantially determined by the value of resistance 105 and the (calibrated) value of capacitance 106.

At time $t_2$, which is less than the minimum pulse length ($t_{min}$) after $t_1$ that pulse filter circuitry 100 is configured to filter out, IN switches back to a logical "0" from a logical "1". Note that also at $t_2$, CN has not charged enough to exceed $V_T$ and thereby change OUT (output of slicer 120) to a logical "1". Accordingly, after $t_2$, IN and OUT are both logical "0"'s. Because IN and OUT are both logical "0"'s, $CNTL_{131}$ switches to a logical "1" and is thereby resumes holding CN at the negative reference voltage without any change in OUT as a result of the pulse on IN that was less than $t_{min}$. In other words, the positive pulse on IN illustrated between $t_1$ and $t_2$, was filtered out by pulse filter circuitry 100.

At time $t_3$, IN again switches from a logical "0" to a logical "1". Thus, because IN and OUT are no longer both logical "0"'s, $CNTL_{131}$ switches to a logical "0" and is thereby no longer holding CN at the negative reference voltage. As with the period between $t_1$ and $t_2$, because the output of buffer 110 rises with the switching of IN, and because $CNTL_{131}$ is no longer holding CN to the negative reference voltage, buffer 110 begins charging capacitance 106 via resistance 105. At $t_4$, which is $t_{min}$ after $t_3$ (i.e., capacitance 106 has been charging for $t_{min}$ amount of time), CN has charged enough to cross to exceed $V_T$ thereby causing slicer 120 to change the state of OUT from a logical "0" to a logical "1". Thus, at $t_4$, since IN and OUT are now both logical "1"'s, $CNTL_{132}$ switches to a logical "1" thereby pulling CN, via switching circuitry 132, to the positive reference voltage.

At time $t_5$, IN switches from a logical "1" to a logical "0". Thus, because IN and OUT are no longer both logical "1"'s, $CNTL_{132}$ switches to a logical "0" and is thereby no longer holding CN at the positive reference voltage. Because the output of buffer 110 falls with the switching of IN, and because $CNTL_{132}$ is no longer holding CN to the positive reference voltage, buffer 110 begins discharging capacitance 106 via resistance 105. At $t_6$, which is $t_{min}$ after $t_5$, (i.e., capacitance 106 has been discharging for $t_{min}$ amount of time) CN has discharged enough to fall below $V_T$ thereby causing slicer 120 to change the state of OUT from a logical "1" to a logical "0". Thus, at $t_6$, since IN and OUT are now both logical "0"'s, $CNTL_{131}$ switches to a logical "1" thereby pulling CN, via switching circuitry 131, to the negative reference voltage.

In FIG. 2B, the input signal (IN) and the output signal (OUT) both start as a logical "1"'s. CN is at the positive reference voltage and is therefore above the threshold voltage ($V_T$) of slicer 120. Thus, since IN and OUT are both logical "1"'s, $CNTL_{132}$ is at a logical "1" and $CNTL_{131}$ is at a logical "1". Since $CNTL_{132}$ is at a logical "1", switching circuitry 132 is conducting thereby holding CN at the positive reference voltage.

At time $t_1$, IN switches from a logical "1" to a logical "0". Thus, because IN and OUT are no longer both logical "1"'s, $CNTL_{132}$ switches to a logical "0" and is thereby no longer holding CN at the positive reference voltage. Because the output of buffer 110 falls with the switching of IN, and because $CNTL_{131}$ is no longer holding CN to the positive reference voltage, buffer 110 begins discharging capacitance 106 via resistance 105—thereby forming an RC discharging circuit with a time constant that is substantially determined by the value of resistance 105 and the (calibrated) value of capacitance 106.

At time $t_2$, which is less than the minimum pulse length ($t_{min}$) after $t_1$ that pulse filter circuitry 100 is configured to filter out, IN switches back to a logical "1" from a logical "0". Note that also at $t_2$, CN has not discharged enough to fall below $V_T$ and thereby change OUT (output of slicer 120) to a logical "0". Accordingly, after $t_2$, IN and OUT are both logical "1"'s. Because IN and OUT are both logical "1"'s, $CNTL_{132}$ switches to a logical "1" and is thereby resumes holding CN at the positive reference voltage without any change in OUT as a result of the pulse on IN that was less than $t_{min}$. In other words, the negative pulse on IN illustrated between $t_1$ and $t_2$, was filtered out by pulse filter circuitry 100.

At time $t_3$, IN again switches from a logical "1" to a logical "0". Thus, because IN and OUT are no longer both logical "1"'s, $CNTL_{132}$ switches to a logical "0" and is thereby no longer holding CN at the positive reference voltage. As with the period between $t_1$ and $t_2$, because the output of buffer 110 falls with the switching of IN, and because $CNTL_{132}$ is no longer holding CN to the positive reference voltage, buffer 110 begins discharging capacitance 106 via resistance 105. At $t_4$, which is $t_{min}$ after $t_3$ (i.e., capacitance 106 has been discharging for $t_{min}$ amount of time), CN has discharged enough to fall below $V_T$ thereby causing slicer 120 to change the state of OUT from a logical "1" to a logical "0". Thus, at $t_4$, since IN and OUT are now both logical "0"'s, $CNTL_{131}$ switches to a logical "1" thereby pulling CN, via switching circuitry 131, to the negative reference voltage.

At time $t_5$, IN switches from a logical "0" to a logical "1". Thus, because IN and OUT are no longer both logical "0"'s, $CNTL_{131}$ switches to a logical "0" and is thereby no longer holding CN at the negative reference voltage. Because the output of buffer 110 rises with the switching of IN, and because $CNTL_{131}$ is no longer holding CN to the negative reference voltage, buffer 110 begins charging capacitance 106 via resistance 105. At $t_6$, which is $t_{min}$ after $t_5$, (i.e., capacitance 106 has been charging for $t_{min}$ amount of time) CN has charged enough to exceed $V_T$ thereby causing slicer 120 to change the state of OUT from a logical "0" to a logical "1". Thus, at $t_6$, since IN and OUT are now both logical "1"'s, $CNTL_{132}$ switches to a logical "1" thereby pulling CN, via switching circuitry 131, to the positive reference voltage.

Figure 1B:
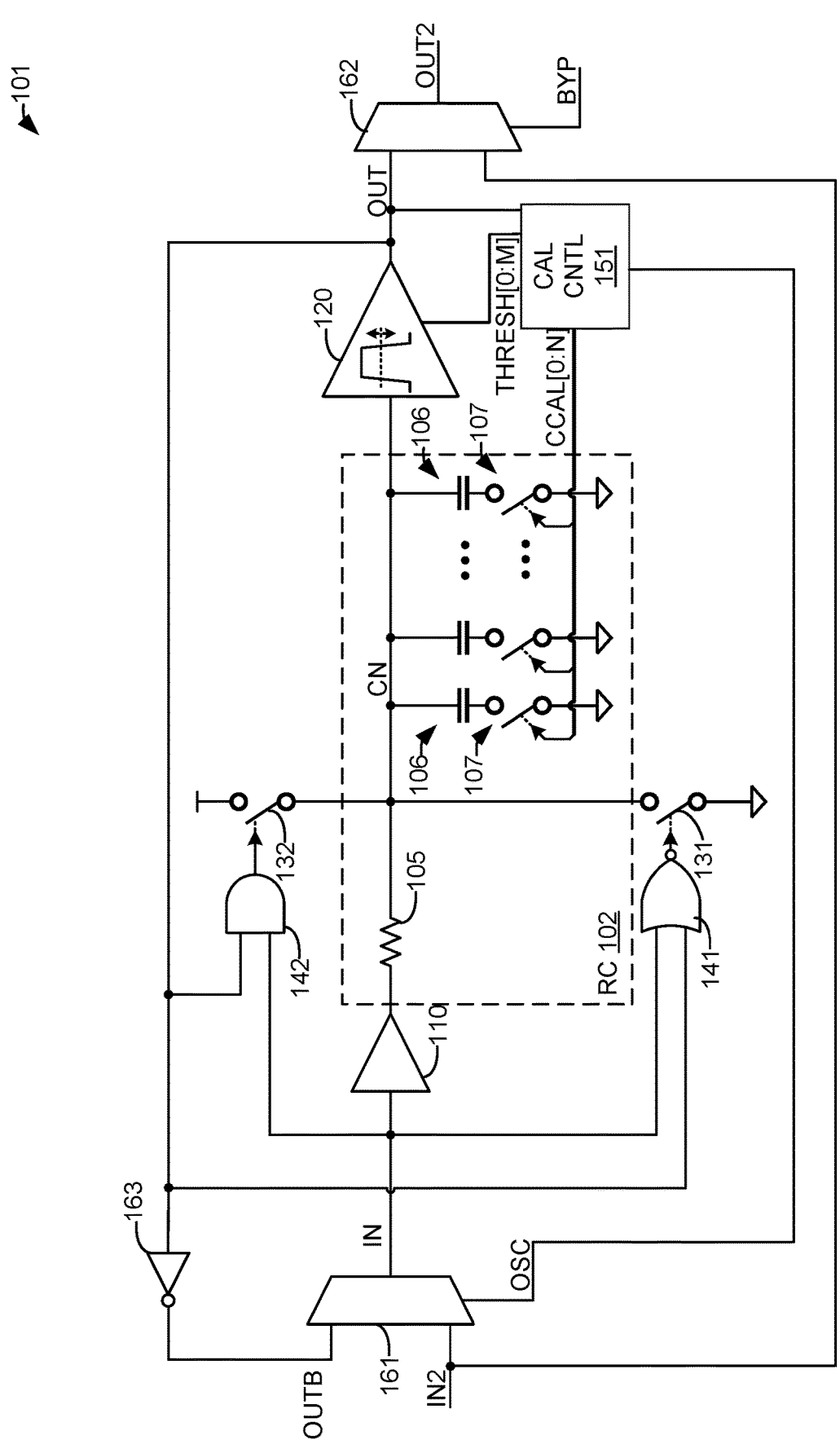
FIG. 1B is a diagram illustrating configurable circuitry including a pulse filter.

FIG. 1B is a diagram illustrating configurable circuitry including a pulse filter. In FIG. 1B, configurable pulse filter circuitry 101 comprises resistance-capacitance (RC) charging-discharging circuitry 102 (e.g., RC filter), buffer 110, slicer 120, switching circuitry 131, switching circuitry 132, 2-input NOR gate 141, 2-input AND gate 142, calibration control circuitry 151, 2:1 multiplexer 161, 2:1 multiplexer 162, and inverter 163. RC charging-discharging circuitry 102 includes resistance 105, adjustable capacitance 106, and capacitance adjustment circuitry 107. The input to pulse filter circuitry 101 is the signal IN2 and the output is the signal OUT2.

From FIG. 1B, it should be understood that configurable pulse filter circuitry 101 is substantially the same as pulse filter circuitry 100 with the addition of multiplexer 161, multiplexer 162, and inverter 163. The addition of multiplexer 162 which, when enabled by the signal BYP, provides a configurable "bypass" path from IN2 to OUT2. The addition of multiplexer 161 and inverter 163 which, when enabled by calibration control circuitry 151, provide a configurable inverting feedback path from OUT to IN thereby forming a ring oscillator. Configuring pulse filter circuitry 101 as a ring oscillator provides a means for calibrating capacitance 106, the threshold of slicer 120, or both, by measuring the frequency of oscillations by the ring oscillator. Otherwise, pulse filter circuitry 101 functions substantially the same as pulse filter circuitry 100 illustrated in FIG. 1A so discussion of that functioning will, for the sake of brevity, not be repeated here.

Figure 3:
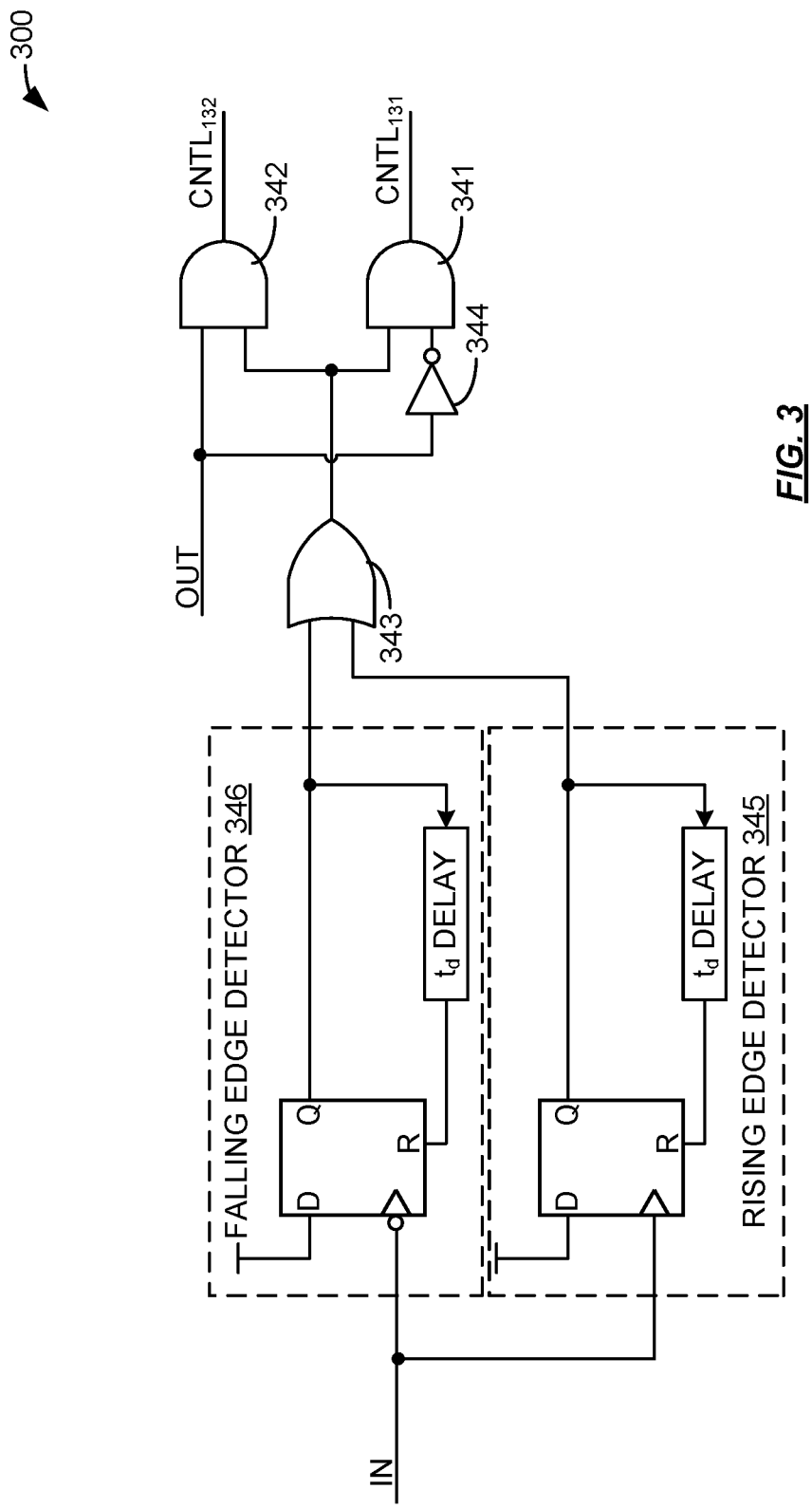
FIG. 3 is a diagram illustrating example control circuitry for a pulse filter.

FIG. 3 is a diagram illustrating example control circuitry for a pulse filter. In FIG. 3, control circuitry 300 comprises 2-input AND gate 341, 2-input AND gate 342, 2-input OR gate 343, inverter 344, rising edge detector 345, and falling edge detector 346. Control circuitry 300 may, for example, replace NOR gate 141 and AND gate 142 in pulse filter circuitry 100 or pulse filter circuitry 101 as the controls for switching circuitry 131 and switching circuitry 132.

Rising edge detector 345 responds to a rising edge on the pulse filter input (IN) with a positive pulse that is to in duration. Falling edge detector 346 responds to a falling edge on the pulse filter input (IN) with a positive pulse that is to in duration. The outputs of rising edge detector 345 and falling edge detector 346 are provided as the inputs to OR gate 343. The output of OR gate 343 is provided to a first input of AND gate 341 and a first input of AND gate 342. The output of the pulse filter (OUT) is provided to the second input of AND gate 342. OUT is also inverted by inverter 344 and provided to the second input of AND gate 341. The output of AND gate 341 is the control signal $CNTL_{131}$ that controls switching circuitry 131 to either be in a high impedance (i.e., "off") state or to conduct and discharge capacitance 106 to the negative supply voltage. The output of AND gate 342 is the control signal $CNTL_{132}$ that controls switching circuitry 132 to either be in a high impedance (i.e., "off") state or to conduct and charge capacitance 106 to the positive supply voltage.

Figure 4A:
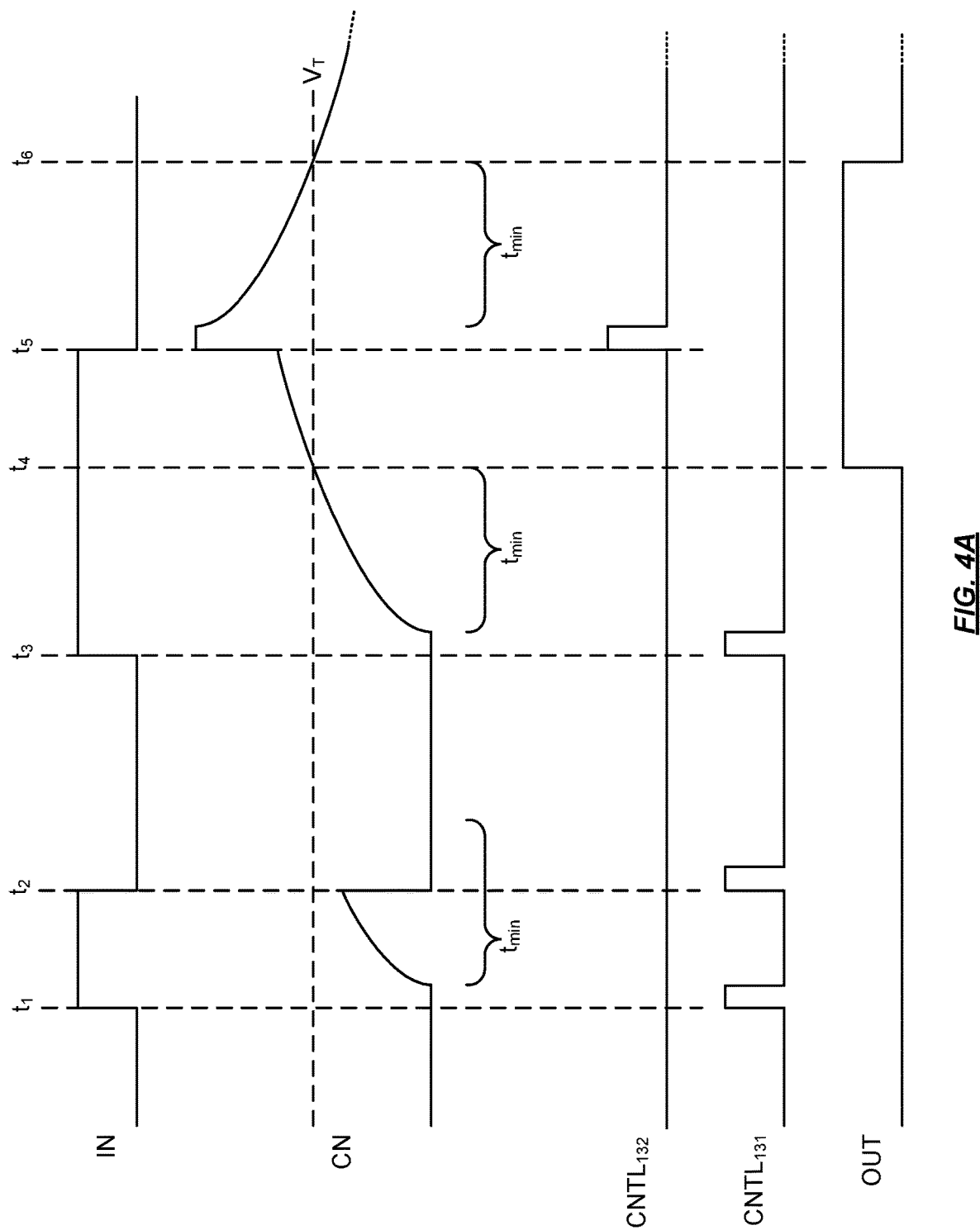
FIGS. 4A-4B are example timing diagrams illustrating the operations of a pulse filter.
Figure 4B:
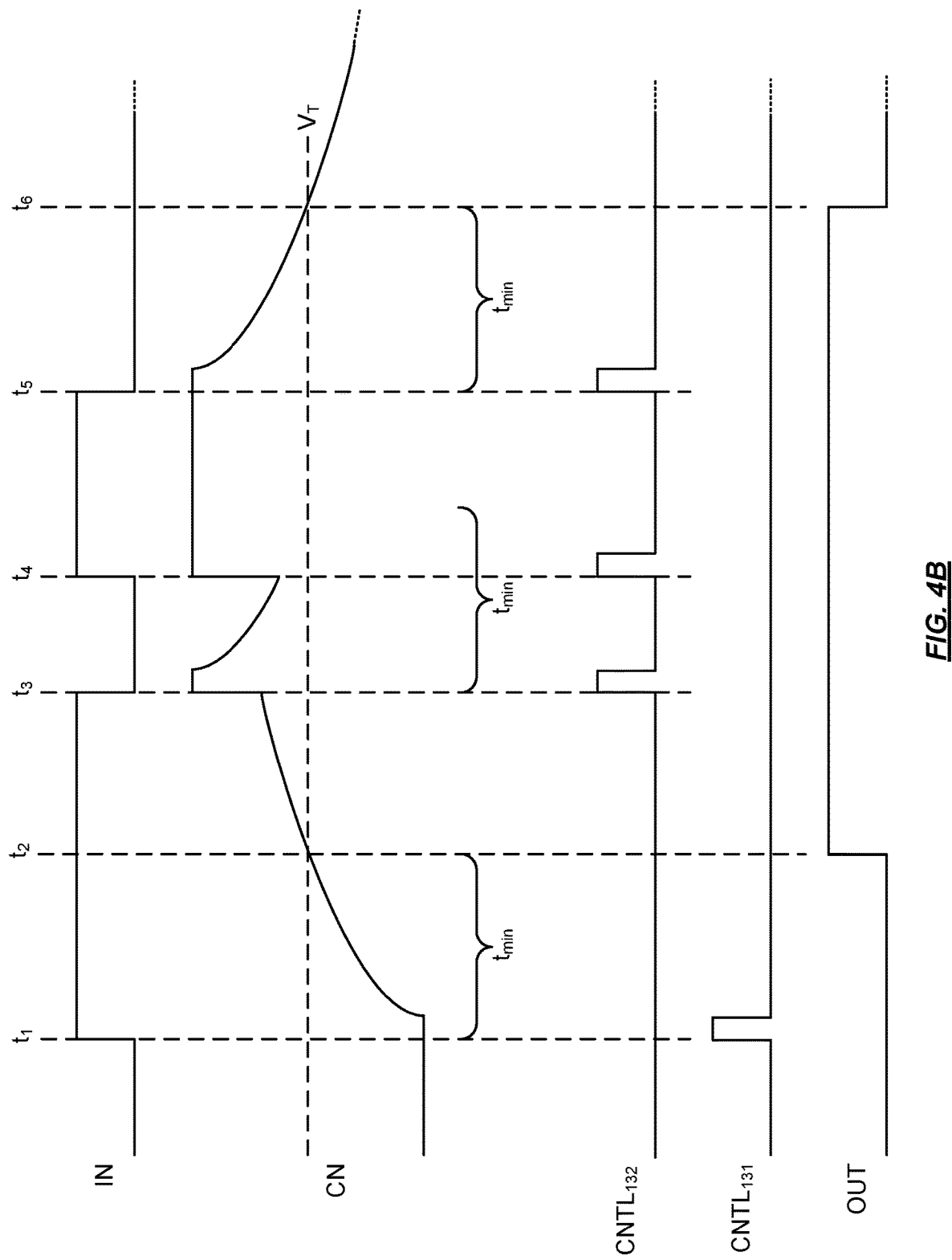

FIGS. 4A-4B are example timing diagrams illustrating the operations of a pulse filter. In FIG. 4A, the input signal (IN) and the output signal (OUT) both start as a logical "0"'s. CN is at the negative reference voltage and is therefore below the threshold voltage ($V_T$) of slicer 120. $CNTL_{131}$ is at a logical "0" and $CNTL_{132}$ is at a logical "0".

At time $t_1$, IN switches from a logical "0" to a logical "1". Thus, because there was a rising edge on IN, edge detector 345 outputs a positive pulse of $t_d$ duration. This pulse is passed by OR gate 343 to the first input of AND gate 341 and the first input of AND gate 342. Since OUT is low, the pulse is blocked by AND gate 342 and passed by AND gate 341 to $CNTL_{131}$. Thus, $CNTL_{131}$ switches to a logical "1" for a $t_d$ amount of time thereby pulling CN to the negative reference voltage for $t_d$. After $t_d$ from the rising edge of IN, because the output of buffer 110 rises with the switching of IN, and because $CNTL_{131}$ is no longer pulling CN to the negative reference voltage, buffer 110 begins charging capacitance 106 via resistance 105—thereby forming an RC charging circuit with a time constant that is substantially determined by the value of resistance 105 and the (calibrated) value of capacitance 106.

At time $t_2$, which is less than the minimum pulse length ($t_{min}$) after $t_1$ that pulse filter circuitry 100 is configured to filter out, IN switches back to a logical "0" from a logical "1". Note that also at $t_2$, CN has not charged enough to exceed $V_T$ and thereby change OUT (output of slicer 120) to a logical "1". Accordingly, after $t_2$, IN and OUT are both logical "0"'s. Thus, because there was a falling edge on IN, edge detector 346 outputs a positive pulse of $t_d$ duration.

This pulse is passed by OR gate 343 to the first input of AND gate 341 and the first input of AND gate 342. Since OUT is low, the pulse is blocked by AND gate 342 and passed by AND gate 341 to $CNTL_{131}$. Thus, $CNTL_{131}$ switches to a logical "1" for a $t_d$ amount of time thereby pulling CN to the negative reference voltage for $t_d$. After $t_d$ from the falling edge of IN, because the output of buffer 110 fell with the switching of IN, buffer 111 continues to hold CN at the negative reference voltage without OUT switching in response to the $t_1$ to $t_2$ pulse on IN. In other words, the positive pulse on IN illustrated between $t_1$ and $t_2$, was filtered out by pulse filter circuitry 100.

At time $t_3$, IN again switches from a logical "0" to a logical "1". Thus, because there was a rising edge on IN, edge detector 345 outputs a positive pulse of $t_d$ duration. This pulse is passed by OR gate 343 to the first input of AND gate 341 and the first input of AND gate 342. Since OUT is low, the pulse is blocked by AND gate 342 and passed by AND gate 341 to $CNTL_{131}$. Thus, $CNTL_{131}$ switches to a logical "1" for a $t_d$ amount of time thereby pulling CN to the negative reference voltage for $t_d$. After $t_d$ from the rising edge of IN, because the output of buffer 110 rises with the switching of IN, and because $CNTL_{131}$ is no longer pulling CN to the negative reference voltage, buffer 110 begins charging capacitance 106 via resistance 105. At $t_4$, which is $t_{min}$ after $t_3$ (i.e., capacitance 106 has been charging for $t_{min}$ amount of time), CN has charged enough to cross to exceed $V_T$ thereby causing slicer 120 to change the state of OUT from a logical "0" to a logical "1".

At time $t_5$, IN switches from a logical "1" to a logical "0". Because there was a falling edge on IN, edge detector 346 outputs a positive pulse of $t_d$ duration. This pulse is passed by OR gate 343 to the first input of AND gate 341 and the first input of AND gate 342. Since OUT is high, the pulse is passed by AND gate 342 to $CNTL_{132}$ and blocked by AND gate 341. Thus, $CNTL_{132}$ switches to a logical "1" for a $t_d$ amount of time thereby pulling CN to the positive reference voltage for $t_d$. After $t_d$ from the falling edge of IN, because the output of buffer 110 falls with the switching of IN, and because $CNTL_{132}$ is no longer pulling CN to the positive reference voltage, buffer 110 begins discharging capacitance 106 via resistance 105. At $t_6$, which is $t_{min}$ after $t_5$, (i.e., capacitance 106 has been discharging for $t_{min}$ amount of time) CN has discharged enough to fall below $V_T$ thereby causing slicer 120 to change the state of OUT from a logical "1" to a logical "0". In other words, because IN was low for at least Liam amount of time, the falling edge of IN at $t_5$ is not filtered out.

In FIG. 4B, the input signal (IN) and the output signal (OUT) both start as a logical "0"'s. CN is at the negative reference voltage and is therefore below the threshold voltage ($V_T$) of slicer 120. $CNTL_{131}$ is at a logical "0" and $CNTL_{132}$ is at a logical "0".

At time $t_1$, IN switches from a logical "0" to a logical "1". Thus, because there was a rising edge on IN, edge detector 345 outputs a positive pulse of $t_d$ duration. This pulse is passed by OR gate 343 to the first input of AND gate 341 and the first input of AND gate 342. Since OUT is low, the pulse is blocked by AND gate 342 and passed by AND gate 341 to $CNTL_{131}$. Thus, $CNTL_{131}$ switches to a logical "1" for a $t_d$ amount of time thereby pulling CN to the negative reference voltage for $t_d$. After $t_d$ from the rising edge of IN, because the output of buffer 110 rises with the switching of IN, and because $CNTL_{131}$ is no longer pulling CN to the negative reference voltage, buffer 110 begins charging capacitance 106 via resistance 105—thereby forming an RC charging circuit with a time constant that is substantially determined by the value of resistance 105 and the (calibrated) value of capacitance 106.

At $t_2$, which is $t_{min}$ after $t_1$ (i.e., capacitance 106 has been charging for $t_{min}$ amount of time), CN has charged enough to cross to exceed $V_T$ thereby causing slicer 120 to change the state of OUT from a logical "0" to a logical "1". At time $t_3$, IN switches from a logical "1" to a logical "0". Because there was a falling edge on IN, edge detector 346 outputs a positive pulse of $t_d$ duration. This pulse is passed by OR gate 343 to the first input of AND gate 341 and the first input of AND gate 342. Since OUT is high, the pulse is passed by AND gate 342 to $CNTL_{132}$ and blocked by AND gate 341. Thus, $CNTL_{132}$ switches to a logical "1" for a $t_d$ amount of time thereby pulling CN to the positive reference voltage for $t_d$. After $t_d$ from the falling edge of IN, because the output of buffer 110 falls with the switching of IN, and because $CNTL_{132}$ is no longer pulling CN to the positive reference voltage, buffer 110 begins discharging capacitance 106 via resistance 105.

At time $t_4$, which is less than the minimum pulse length ($t_{min}$) after $t_3$ that pulse filter circuitry 100 is configured to filter out, IN switches back to a logical "1" from a logical "0". Note that also at $t_4$, CN has not discharged enough to fall below $V_T$ and thereby change OUT (output of slicer 120) to a logical "0". Accordingly, after $t_4$, IN and OUT are both logical "1"'s. Thus, because there was a rising edge on IN, edge detector 345 outputs a positive pulse of $t_d$ duration. This pulse is passed by OR gate 343 to the first input of AND gate 341 and the first input of AND gate 342. Since OUT is high, the pulse is blocked by AND gate 341 and passed by AND gate 342 to $CNTL_{132}$. Thus, $CNTL_{132}$ switches to a logical "1" for a $t_d$ amount of time thereby pulling CN to the positive reference voltage for $t_d$. After $t_d$ from the rising edge of IN, because the output of buffer 110 rose with the switching of IN, buffer 111 continues to hold CN at the positive reference voltage without OUT switching in response to the $t_3$ to $t_4$ pulse on IN. In other words, the negative pulse on IN illustrated between $t_3$ and $t_4$, was filtered out by pulse filter circuitry 100.

At time $t_5$, IN switches from a logical "1" to a logical "0". Because there was a falling edge on IN, edge detector 346 outputs a positive pulse of $t_d$ duration. This pulse is passed by OR gate 343 to the first input of AND gate 341 and the first input of AND gate 342. Since OUT is high, the pulse is passed by AND gate 342 to $CNTL_{132}$ and blocked by AND gate 341. Thus, $CNTL_{132}$ switches to a logical "1" for a $t_d$ amount of time thereby pulling CN to the positive reference voltage for $t_d$. After $t_d$ from the falling edge of IN, because the output of buffer 110 falls with the switching of IN, and because $CNTL_{132}$ is no longer pulling CN to the positive reference voltage, buffer 110 begins discharging capacitance 106 via resistance 105. At $t_6$, which is $t_{min}$ after $t_5$, (i.e., capacitance 106 has been discharging for $t_{min}$ amount of time) CN has discharged enough to fall below $V_T$ thereby causing slicer 120 to change the state of OUT from a logical "1" to a logical "0". In other words, because IN was low for at least $t_{min}$ amount of time, the falling edge of IN at $t_5$ is not filtered out.

Figure 5:
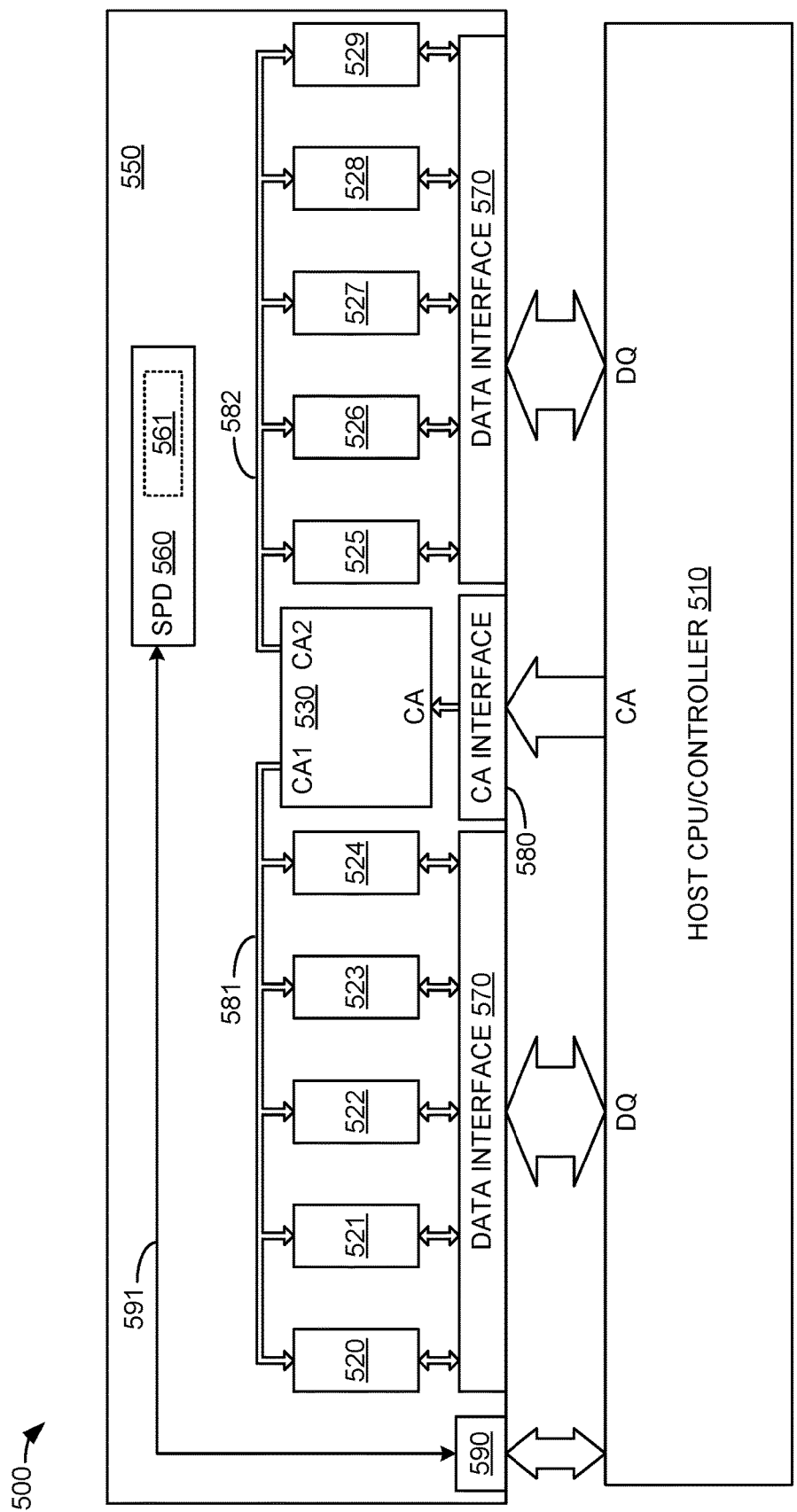
FIG. 5 is a block diagram illustrating a memory system.

FIG. 5 is a block diagram illustrating a memory system. In FIG. 5, memory system 500 comprises host CPU/controller (host) 510 and module 550. Host 510 is operatively coupled to module 550 via data signals (DQ), command-address signals (CA), and serial presence detect signals. Module 550 includes memory components 520-529, buffer device 530, serial presence detect (SPD) device 560, data interface 570, command-address interface 580, and SPD interface 590. Command-address interface 580 is operatively coupled to buffer device 530. Buffer device 530 is operatively coupled to memory components 520-524 via secondary command-address signals CA1 581 (also referred to as CA bus 581). Buffer device 530 is operatively coupled to memory components 525-529 via secondary command-address signals CA2 582 (also referred to as CA bus 582).

SPD interface 590 is operatively coupled to SPD device 560 via SPD signals 591. SPD device 560 includes pulse filter circuitry 561. SPD interface 590 and SPD signals 591 may implement or conform to a serial channel communication protocol or specification. For example, SPD interface 590 and SPD signals 591 may be, or comprise, one or more signals that conform to a serial presence detect (SPD) bus, I2C bus, and/or I3C bus. SPD device 560 may be, or comprise, pulse filter circuitry 100, pulse filter circuitry 101, and/or control circuitry 300, as discussed herein.

Buffer device 530 may also be referred to as a command/address (CA) Register. Thus, module 550 may be considered to be a registered module, or Registered Dual Inline Memory Module (R-DIMM). This, however, is merely one example of the types of module that may include SPD device 560. Other examples of modules include dual inline memory module (DIMM) such as DDR4, DDR5 etc. DIMM, load reduced DIMM (LRDIMM), registered DIMM (RDIMM), fully buffered DIMM (FB-DIMM), or unbuffered DIMM (UDIMM).

Host 510, memory components 520-529, buffer device 530, and SPD device 560 may be or comprise integrated circuit type devices, such as are commonly referred to as "chips". The controller functionality of a memory controller (such as the controller functionality of host 510) manages the flow of data going to and from memory devices and/or memory modules. Memory components 520-529 may be standalone devices, or may include multiple memory integrated circuit dies—such as components of a multi-chip module. A memory controller can be a separate, standalone chip, or integrated into another chip. For example, a memory controller may be included on a single die with a microprocessor, or included as part of a more complex integrated circuit system such as a block of a system on a chip (SOC).

Buffer device 530 is operatively coupled to CA interface 580 and memory components 520-529 to help isolate the electrical loading of the on-module DRAM memory components 520-529 from the command-address channel coupled to host 510. Without buffer device 530, the aggregate load of memory components 520-529 would degrade the achievable signaling rate of the command-address channel and hence the overall bandwidth performance of the memory subsystem. In an embodiment, all command-address traffic sent between host 510 and memory components 520-529 is first received by buffer device 530 via CA interface 580.

In FIG. 5, a single CA interface 580 and two sets of secondary CA signals 581-582 are illustrated. It should be understood however, that in some embodiments, buffer device 530 may receive independent CA signals over two respective independent CA interfaces. These sets of independent CA signals may be received, for example, on opposite sides of module 550. In another example, these sets of independent CA signals may be time or otherwise multiplexed with each other on the same set of signal traces. Buffer device 530 may receive each of the two sets of independent CA signals and drive each of the two sets of CA signals, respectively, to two secondary CA signal sets (i.e., two channels from a host to 4 CA channels, where each DRAM channel includes a set of 4 or 5 DRAMs—two DRAM channels on the right and two DRAM channels on the left.)

FIG. 6 is a flowchart illustrating a method of operating a pulse filter. One or more steps illustrated in FIG. 6 may be performed by, for example, pulse filter circuitry 100, pulse filter circuitry 101, control circuitry 300, memory system 500, and/or their components. An input signal having a plurality of pulse widths is received (602). For example, a pulse filter circuitry 100 in SPD device 260 may receive an I2C or I3C signal from host CPU/controller 510.

The input signal is buffered to generate a buffered input signal having the plurality of pulse widths (604). For example, buffer 110 may buffer input signal IN. The buffered input signal is provided to a resistor-capacitor circuit calibrated to a first time constant based on timing information, the resistor-capacitor circuit having a charging-discharging capacitance (606). For example, the output of buffer 110 may be provided to RC charging-discharging circuitry 102 where the total capacitance of adjustable capacitance 106 that is charged and discharged as part of RC charging-discharging circuitry 102 have been adjusted to account for manufacturing variations based on the frequency of oscillations by pulse filter circuitry 100 when configured as part of a ring oscillator.

A charging-discharging signal from the resistor-capacitor circuit is provided to a slicer input of a slicer (608). For example, the charging-discharging signal of node CN may be provided to the input of slicer 120. Based on the slicer determining the charging-discharging signal meets a first threshold condition and the input signal meeting a second threshold condition, the charging-discharging capacitance is charged to a first power supply voltage (610). For example, based on node CN exceeding the threshold voltage $V_T$ of slicer 120, and based on the input signal IN being a logical "1", AND gate 142 may control switching circuitry 132 to conduct thereby charging capacitance 106 to the positive reference voltage. Based on the slicer determining the charging-discharging signal does not meet the first threshold condition and the input signal meeting a third threshold condition, the charging-discharging capacitance is discharged to a second power supply voltage (612). For example, based on node CN being below the threshold voltage $V_T$ of slicer 120, and based on the input signal IN being a logical "0", NOR gate 141 may control switching circuitry 131 to conduct thereby discharging capacitance 106 to the negative reference voltage.

Figure 7:
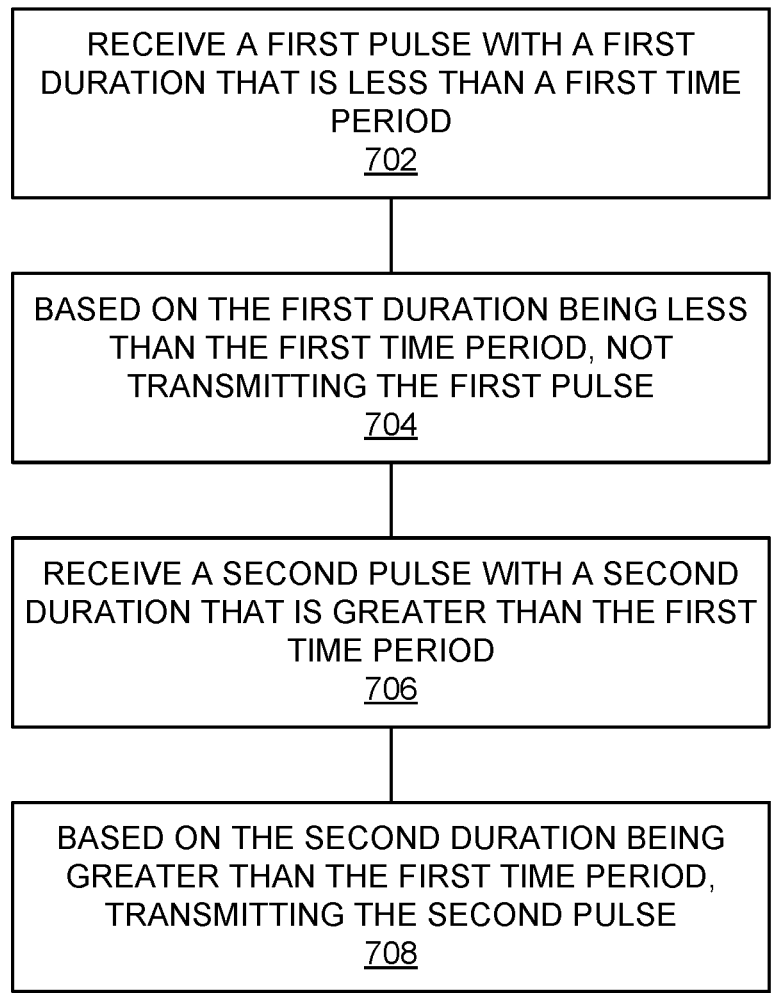
FIG. 7 is a flowchart illustrating a method of operating an integrated circuit.

FIG. 7 is a flowchart illustrating a method of operating an integrated circuit. One or more steps illustrated in FIG. 7 may be performed by, for example, pulse filter circuitry 100, pulse filter circuitry 101, control circuitry 300, memory system 500, and/or their components. A first pulse with a first duration that is less that a first time period is received (702). For example, pulse filter circuitry 100 may receive a pulse between $t_1$ and $t_2$ (see, e.g., FIG. 2A and/or FIG. 2B) that is less than $t_{min}$ in duration where pulse filter circuitry 100 is configured (e.g., by resistance 105 and/or capacitance 106) to filter out pulses that are less than $t_{min}$ in duration.

Based on the first duration being less than the first time period, the first pulse is not transmitted (704). For example, based on the pulse between $t_1$ and $t_2$ being less than $t_{min}$ in duration, pulse filter circuitry 100 may not switch its output OUT in response to the pulse between $t_1$ and $t_2$. A second pulse with a second duration that is greater than the first time period is received (706). For example, pulse filter circuitry 100 may receive a pulse between $t_3$ and is (see, e.g., FIG. 2A and/or FIG. 2B) that is greater than $t_{min}$ in duration where pulse filter circuitry 100 is configured (e.g., by resistance 105 and/or capacitance 106) to filter out pulses that are less than $t_{min}$ in duration.

Based on the second duration being greater than the first time period, the second pulse is transmitted (708). For example, based on the pulse between $t_3$ and $t_5$ being greater than $t_{min}$ in duration, pulse filter circuitry 100 may switch its output OUT in response to the pulse between $t_3$ and $t_5$.

FIG. 8 is a flowchart illustrating a method filtering received pulses. One or more steps illustrated in FIG. 8 may be performed by, for example, pulse filter circuitry 100, pulse filter circuitry 101, control circuitry 300, memory system 500, and/or their components. A first pulse with a first duration that is less than a first time period is received (802). For example, pulse filter circuitry 100 may receive a pulse between $t_1$ and $t_2$ (see, e.g., FIG. 2A and/or FIG. 2B) that is less than $t_{min}$ in duration where pulse filter circuitry 100 is configured (e.g., by resistance 105 and/or capacitance 106) to filter out pulses that are less than $t_{min}$ in duration.

The first pulse is provided to a resistor-capacitor circuit to generate a first charging-discharging signal (804). For example, buffer 110 may provide the pulse between $t_1$ and $t_2$ to RC charging-discharging circuitry 102 to generate a charging-discharging signal CN at the input to slicer 120. At the end of the first pulse, it is determined that the first charging-discharging signal does not meet a threshold condition (806). For example, at $t_2$, slicer 120 may determine that the charging-discharging signal CN has not crossed $V_T$ during the time period between $t_1$ and $t_2$. Based on the first charging-discharging signal not meeting the threshold condition, not transmitting the first pulse (808). For example, slicer 120 may determine that the charging-discharging signal CN has not crossed $V_T$ during the time period between $t_1$ and $t_2$ thereby causing slicer 120 to change its output signal OUT during the time period between $t_1$ and $t_2$.

A second pulse with a second duration that is greater than the first time period is received (810). For example, pulse filter circuitry 100 may receive a pulse between $t_3$ and $t_5$ (see, e.g., FIG. 2A and/or FIG. 2B) that is greater than $t_{min}$ in duration where pulse filter circuitry 100 is configured (e.g., by resistance 105 and/or capacitance 106) to filter out pulses that are less than $t_{min}$ in duration. The second pulse is provided to the resistor-capacitor circuit to generate a second charging-discharging signal (812). For example, buffer 110 may provide the pulse between $t_{13}$ and $t_5$ to RC charging-discharging circuitry 102 to generate a charging-discharging signal CN at the input to slicer 120. At the end of the second pulse, it is determined that the second charging-discharging signal does not meet a threshold condition (814). For example, at $t_5$, slicer 120 may determine that the charging-discharging signal CN has previously crossed $V_T$ during the time period between $t_3$ and $t_5$. Based on the second charging-discharging signal meeting the threshold condition, transmitting the second pulse (816). For example, slicer 120 may determine that the charging-discharging signal CN has crossed $V_T$ during the time period between $t_3$ and $t_5$ thereby causing slicer 120 to change its output signal OUT during the time period between $t_3$ and $t_5$.

Figure 9:
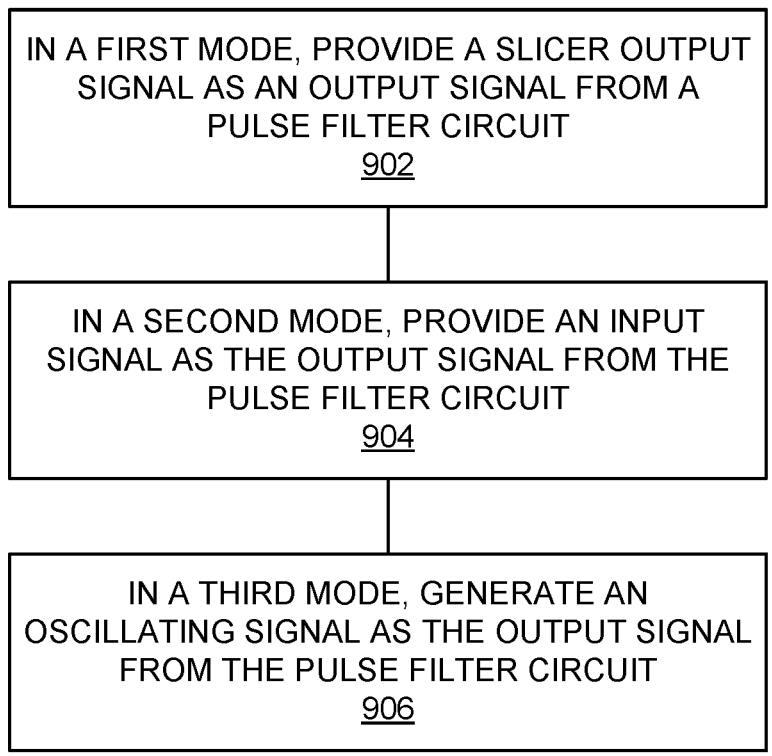
FIG. 9 is a flowchart illustrating a method of reconfiguring pulse filter operations.

FIG. 9 is a flowchart illustrating a method of reconfiguring pulse filter operations. One or more steps illustrated in FIG. 9 may be performed by, for example, pulse filter circuitry 100, pulse filter circuitry 101, control circuitry 300, memory system 500, and/or their components. In a first mode, a slicer output signal is provided as an output signal from a pulse filter circuit (902). For example, multiplexer 162 may be configured to provide the output of slicer 120 OUT as the output signal OUT2 of pulse filter circuitry 101.

In a second mode, an input signal is provided as the output signal from the pulse filter circuit (904). For example, multiplexer 162 may be configured to provide the input signal IN2 as the output signal OUT2 of pulse filter circuitry 101. In a third mode, an oscillating signal is generated as the output signal from the pulse filter circuit (906). For example, multiplexer 161 may be configured to provide an inverter version of the output of slicer 120 to the input IN of buffer 110 thereby forming a ring oscillator that, when multiplexer 162 is not in bypass mode, will output an oscillating signal on the output signal OUT2 of pulse filter circuitry 101.

The methods, systems and devices described above may be implemented in computer systems, or stored by computer systems. The methods described above may also be stored on a non-transitory computer readable medium. Devices, circuits, and systems described herein may be implemented using computer-aided design tools available in the art, and embodied by computer-readable files containing software descriptions of such circuits. This includes, but is not limited to one or more elements of pulse filter circuitry 100, pulse filter circuitry 101, control circuitry 300, memory system 500, and their components. These software descriptions may be: behavioral, register transfer, logic component, transistor, and layout geometry-level descriptions. Moreover, the software descriptions may be stored on storage media or communicated by carrier waves.

Data formats in which such descriptions may be implemented include, but are not limited to: formats supporting behavioral languages like C, formats supporting register transfer level (RTL) languages like Verilog and VHDL, formats supporting geometry description languages (such as GDSII, GDSIII, GDSIV, CIF, and MEBES), and other suitable formats and languages. Moreover, data transfers of such files on machine-readable media may be done electronically over the diverse media on the Internet or, for example, via email. Note that physical files may be implemented on machine-readable media such as: 4 mm magnetic tape, 8 mm magnetic tape, 3½ inch floppy media, CDs, DVDs, and so on.

Figure 10:
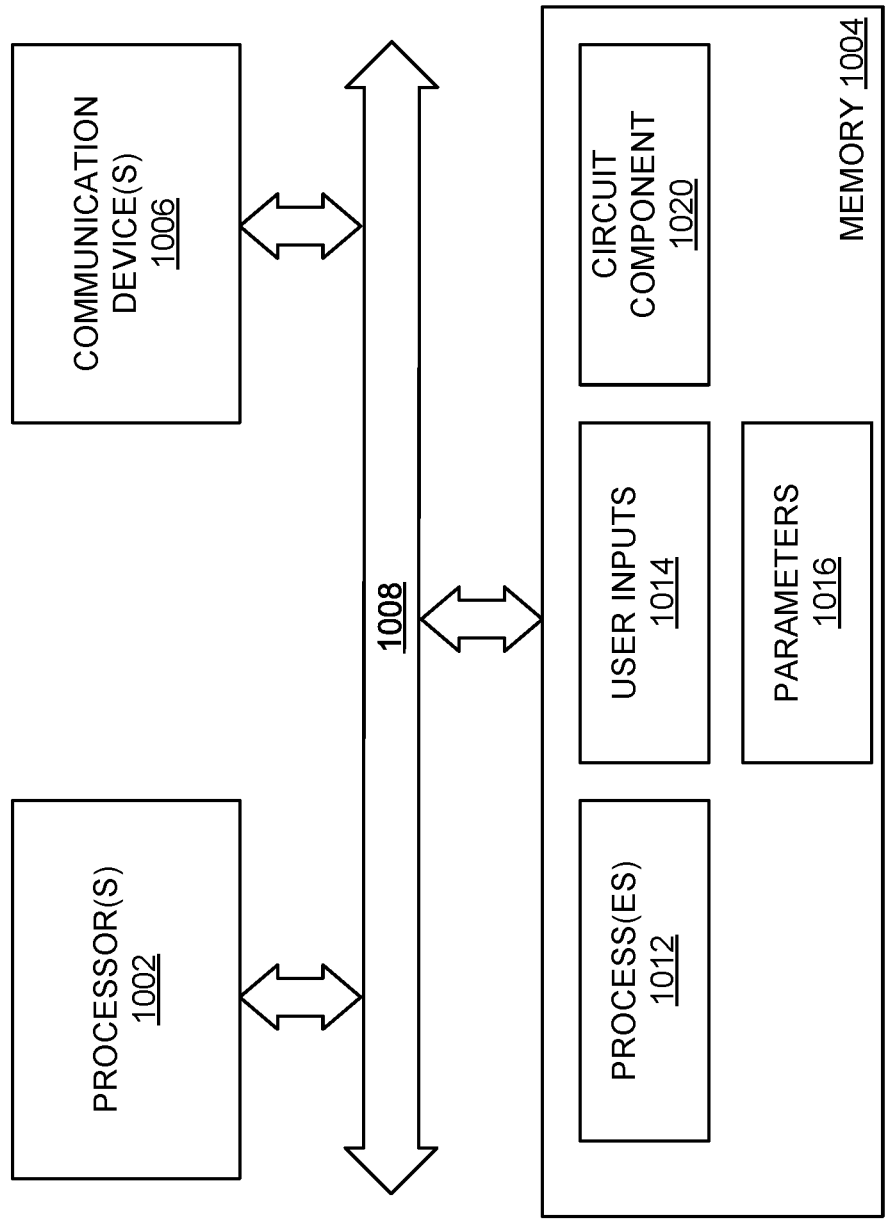
FIG. 10 is a block diagram illustrating a processing system.

FIG. 10 is a block diagram illustrating one embodiment of a processing system 1000 for including, processing, or generating, a representation of a circuit component 1020. Processing system 1000 includes one or more processors 1002, a memory 1004, and one or more communications devices 1006. Processors 1002, memory 1004, and communications devices 1006 communicate using any suitable type, number, and/or configuration of wired and/or wireless connections 1008.

Processors 1002 execute instructions of one or more processes 1012 stored in a memory 1004 to process and/or generate circuit component 1020 responsive to user inputs 1014 and parameters 1016. Processes 1012 may be any suitable electronic design automation (EDA) tool or portion thereof used to design, simulate, analyze, and/or verify electronic circuitry and/or generate photomasks for electronic circuitry. Representation 1020 includes data that describes all or portions of pulse filter circuitry 100, pulse filter circuitry 101, control circuitry 300, memory system 500, and their components, as shown in the Figures.

Representation 1020 may include one or more of behavioral, register transfer, logic component, transistor, and layout geometry-level descriptions. Moreover, representation 1020 may be stored on storage media or communicated by carrier waves.

Data formats in which representation 1020 may be implemented include, but are not limited to: formats supporting behavioral languages like C, formats supporting register transfer level (RTL) languages like Verilog and VHDL, formats supporting geometry description languages (such as GDSII, GDSIII, GDSIV, CIF, and MEBES), and other suitable formats and languages. Moreover, data transfers of such files on machine-readable media may be done electronically over the diverse media on the Internet or, for example, via email User inputs 1014 may comprise input parameters from a keyboard, mouse, voice recognition interface, microphone and speakers, graphical display, touch screen, or other type of user interface device. This user interface may be distributed among multiple interface devices. Parameters 1016 may include specifications and/or characteristics that are input to help define representation 1020. For example, parameters 1016 may include information that defines device types (e.g., NFET, PFET, etc.), topology (e.g., block diagrams, circuit descriptions, schematics, etc.), and/or device descriptions (e.g., device properties, device dimensions, power supply voltages, simulation temperatures, simulation models, etc.).

Memory 1004 includes any suitable type, number, and/or configuration of non-transitory computer-readable storage media that stores processes 1012, user inputs 1014, parameters 1016, and circuit component 1020.

Communications devices 1006 include any suitable type, number, and/or configuration of wired and/or wireless devices that transmit information from processing system 1000 to another processing or storage system (not shown) and/or receive information from another processing or storage system (not shown). For example, communications devices 1006 may transmit circuit component 1020 to another system. Communications devices 1006 may receive processes 1012, user inputs 1014, parameters 1016, and/or circuit component 1020 and cause processes 1012, user inputs 1014, parameters 1016, and/or circuit component 1020 to be stored in memory 1004.

Implementations discussed herein include, but are not limited to, the following examples:

Example 1: An integrated circuit, comprising: an input buffer having a first input coupled to an input node to receive an input signal having a plurality of pulse widths and to produce a buffer output; a slicer having a slicer input and a slicer output signal; a resistor-capacitor charging-discharging circuit coupled between the buffer output and the slicer input, the resistor-capacitor charging-discharging circuit calibrated to a first time constant based on timing information; charging and discharging circuitry to charge and discharge a capacitance of the resistor-capacitor charging-discharging circuit in response to the input signal and the slicer output signal; and pulse with adjustment circuitry coupled to the slicer.

Example 2: The integrated circuit of example 1, wherein the timing information is generated using oscillator circuitry.

Example 3: The integrated circuit, of example 1, further comprising: capacitance adjustment circuitry to adjust a capacitance value of the capacitance of the resistor-capacitor charging-discharging circuit.

Example 4: The integrated circuit of example 1, further comprising: first mode circuitry to, in a first mode, provide the slicer output signal as an output signal from a pulse filter circuit.

Example 5: The integrated circuit of example 4, further comprising: second mode circuitry to, in a second mode, provide the input signal as the output signal from the pulse filter circuit.

Example 6: The integrated circuit of example 5, further comprising: third mode circuitry to, in a third mode, provide an inverted slicer output signal to the slicer input to generate an oscillating signal as the output signal from the pulse filter circuit.

Example 7: The integrated circuit of example 6, wherein the input signal is compatible with at least one of an I2C standard and an I3C standard.

Example 8: An integrated circuit, comprising: an input node to receive an input signal having a plurality of pulse widths; an input buffer having a first input coupled to the input node to receive the input signal and to produce a first buffer output signal with the plurality of pulse widths in response to the input signal; a resistance-capacitance (RC) charging-discharging circuit to receive the first buffer output signal, the RC charging-discharging circuit having a first filter output signal, the RC charging-discharging circuit including calibration circuitry to adjust a time constant of the RC charging-discharging circuit; a slicer to determine whether the first filter output signal meets a one of a first threshold condition and a second threshold condition, the slicer including circuitry to adjust a boundary between the first threshold condition and the second threshold condition; and charging and discharging circuitry to, in response to the slicer determining the first filter output signal has transitioned from meeting a first one of the first threshold condition and the second threshold condition to meeting a second one of the first threshold condition and the second threshold condition, couple a voltage to a capacitance of the RC charging-discharging circuit that causes the first filter output signal to further meet the second one of the first threshold condition and the second threshold condition by a larger margin.

Example 9: The integrated circuit of example 8, wherein the time constant of the RC charging-discharging circuit is adjusted using an oscillator function.

Example 10: The integrated circuit of example 8, further comprising: capacitance adjustment circuitry to adjust a capacitance value of the capacitance of the RC charging-discharging circuit.

Example 11: The integrated circuit of example 8, further comprising: first mode circuitry to, in a first mode, provide a slicer output signal from the slicer as an output signal from a pulse filter circuit.

Example 12: The integrated circuit of example 11, further comprising: second mode circuitry to, in a second mode, provide the input signal as the output signal from the pulse filter circuit.

Example 13: The integrated circuit of example 12, further comprising: third mode circuitry to, in a third mode, provide an inverted slicer output signal to the first input to generate an oscillating signal as the output signal from the pulse filter circuit.

Example 14: The integrated circuit of example 13, wherein the input signal is compatible with at least one of an I2C standard and an I3C standard.

Example 15: A method of operating an integrated circuit, comprising: receiving an input signal having a plurality of pulse widths; buffering the input signal to generate a buffered input signal having the plurality of pulse widths; providing the buffered input signal to a resistor-capacitor circuit calibrated to a first time constant based on timing information, the resistor-capacitor circuit having a charging-discharging capacitance; providing a charging-discharging signal from the resistor-capacitor circuit to a slicer input of a slicer; based on the slicer determining the charging-discharging signal meets a first condition and the input signal meeting a second threshold condition, charging the charging-discharging capacitance to a first power supply voltage; and based on the slicer determining the charging-discharging signal meets does not meet the first condition and the input signal meeting a third threshold condition, discharging the charging-discharging capacitance to a second power supply voltage.

Example 16: The method of example 15, further comprising: adjusting a capacitance value of the charging-discharging capacitance.

Example 17: The method of example 15, further comprising: in a first mode, providing a slicer output signal from the slicer as an output signal from a pulse filter circuit.

Example 18: The method of example 17, further comprising: in a second mode, providing the input signal as the output signal from the pulse filter circuit.

Example 19: The method of example 18, further comprising: in a third mode, generating an oscillating signal as the output signal from the pulse filter circuit.

Example 20: The method of example 19, wherein the input signal is compatible with at least one of an I2C standard and an I3C standard.

The foregoing description of the invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. An integrated circuit, comprising:
   an input buffer having a first input coupled to an input node to receive an input signal having a plurality of pulse widths and to produce a buffer output;
   a slicer having a slicer input, a slicer output signal, and slicer threshold adjustment circuitry to control a boundary for the slicer input meeting a first threshold condition that is to cause the slicer to output a first slicer output signal value and the slicer input meeting a second threshold condition that is to cause the slicer to output a second slicer output signal value;
   a resistor-capacitor charging-discharging circuit coupled between the buffer output and the slicer input, the resistor-capacitor charging-discharging circuit calibrated to a first time constant based on timing information;
   charging and discharging circuitry to charge and discharge a capacitance of the resistor-capacitor charging-discharging circuit based on the input signal and the slicer output signal value; and
   pulse with adjustment circuitry coupled to the slicer.

2. The integrated circuit of claim 1, wherein the timing information is generated using oscillator circuitry.

3. The integrated circuit, of claim 1, further comprising:
   capacitance adjustment circuitry to adjust a capacitance value of the capacitance of the resistor-capacitor charging-discharging circuit.

4. The integrated circuit of claim 1, further comprising:
   first mode circuitry to, in a first mode, provide the slicer output signal as an output signal from a pulse filter circuit.

5. The integrated circuit of claim 4, further comprising:
second mode circuitry to, in a second mode, provide the input signal as the output signal from the pulse filter circuit.

6. The integrated circuit of claim 5, further comprising:
third mode circuitry to, in a third mode, provide an inverted slicer output signal to the slicer input to generate an oscillating signal as the output signal from the pulse filter circuit.

7. The integrated circuit of claim 6, wherein the input signal is compatible with at least one of an I2C standard and an I3C standard.

8. An integrated circuit, comprising:
an input node to receive an input signal having a plurality of pulse widths;
an input buffer having a first input coupled to the input node to receive the input signal and to produce a first buffer output signal with the plurality of pulse widths in response to the input signal;
a resistance-capacitance (RC) charging-discharging circuit to receive the first buffer output signal, the RC charging-discharging circuit having a first filter output signal, the RC charging-discharging circuit including calibration circuitry to adjust a time constant of the RC charging-discharging circuit;
a slicer to determine whether the first filter output signal meets a one of a first threshold condition and a second threshold condition, the slicer including circuitry to adjust a boundary between the first threshold condition and the second threshold condition; and
charging and discharging circuitry to, in response to the slicer determining the first filter output signal has transitioned from meeting a first one of the first threshold condition and the second threshold condition to meeting a second one of the first threshold condition and the second threshold condition, couple a voltage to a capacitance of the RC charging-discharging circuit that causes the first filter output signal to further meet the second one of the first threshold condition and the second threshold condition by a larger margin.

9. The integrated circuit of claim 8, wherein the time constant of the RC charging-discharging circuit is adjusted using an oscillator function.

10. The integrated circuit of claim 8, further comprising:
capacitance adjustment circuitry to adjust a capacitance value of the capacitance of the RC charging-discharging circuit.

11. The integrated circuit of claim 8, further comprising:
first mode circuitry to, in a first mode, provide a slicer output signal from the slicer as an output signal from a pulse filter circuit.

12. The integrated circuit of claim 11, further comprising:
second mode circuitry to, in a second mode, provide the input signal as the output signal from the pulse filter circuit.

13. The integrated circuit of claim 12, further comprising:
third mode circuitry to, in a third mode, provide an inverted slicer output signal to the first input to generate an oscillating signal as the output signal from the pulse filter circuit.

14. The integrated circuit of claim 13, wherein the input signal is compatible with at least one of an I2C standard and an I3C standard.

15. A method of operating an integrated circuit, comprising:
receiving an input signal having a plurality of pulse widths;
buffering the input signal to generate a buffered input signal having the plurality of pulse widths;
providing the buffered input signal to a resistor-capacitor circuit calibrated to a first time constant based on timing information, the resistor-capacitor circuit having a charging-discharging capacitance;
providing a charging-discharging signal from the resistor-capacitor circuit to a slicer input of a slicer;
based on the slicer determining the charging-discharging signal meets a first condition and the input signal meeting a second threshold condition, charging the charging-discharging capacitance to a first power supply voltage; and
based on the slicer determining the charging-discharging signal meets does not meet the first condition and the input signal meeting a third threshold condition, discharging the charging-discharging capacitance to a second power supply voltage.

16. The method of claim 15, further comprising:
adjusting a capacitance value of the charging-discharging capacitance.

17. The method of claim 15, further comprising:
in a first mode, providing a slicer output signal from the slicer as an output signal from a pulse filter circuit.

18. The method of claim 17, further comprising:
in a second mode, providing the input signal as the output signal from the pulse filter circuit.

19. The method of claim 18, further comprising:
in a third mode, generating an oscillating signal as the output signal from the pulse filter circuit.

20. The method of claim 19, wherein the input signal is compatible with at least one of an I2C standard and an I3C standard.

* * * * *